United States Patent [19]

Trefonas, III et al.

[11] Patent Number: 5,350,714
[45] Date of Patent: Sep. 27, 1994

[54] POINT-OF-USE PURIFICATION

[75] Inventors: Peter Trefonas, III, Medway; Richard J. Carey, Sherborn, both of Mass.

[73] Assignee: Shipley Company Inc., Marlborough, Mass.

[21] Appl. No.: 148,354

[22] Filed: Nov. 8, 1993

[51] Int. Cl.$^5$ .......................................... H01L 21/312
[52] U.S. Cl. .................... 437/229; 210/660; 210/663; 430/5
[58] Field of Search ............. 210/259, 900, 660, 663; 437/229; 430/4, 5; 427/372.2

[56] References Cited

U.S. PATENT DOCUMENTS

| | | | |
|---|---|---|---|
| 4,430,226 | 2/1984 | Hegde et al. | 210/673 |
| 4,760,014 | 7/1988 | Wong | 210/723 |
| 4,778,532 | 10/1988 | McConnell et al. | 134/10 |
| 4,863,608 | 9/1989 | Kawai et al. | 210/638 |
| 4,917,123 | 4/1990 | McConnell et al. | 134/95 |
| 5,032,218 | 7/1991 | Dobson | 156/642 |
| 5,112,491 | 5/1992 | Strantz, Jr. | 210/651 |
| 5,232,460 | 8/1993 | Botz | 210/167 |

FOREIGN PATENT DOCUMENTS

| | | |
|---|---|---|
| 1228560 | 9/1989 | Japan . |
| 93/12152 | 6/1993 | World Int. Prop. O. . |

*Primary Examiner*—Cynthia L. Nessler
*Attorney, Agent, or Firm*—Robert L. Goldberg

[57] ABSTRACT

The invention is for a process of removal of dissolved contaminants from an organic solution. The process of the invention involves placing a module containing an ion exchange resin, activated carbon or a mixture of the two between a container from which the organic solution is dispensed and the point at which the solution is to be used. The solution is then passed through the module to remove contaminants. The inventions is useful for removal of dissolved contaminants from organic solutions requiring high purity for use.

12 Claims, No Drawings

POINT-OF-USE PURIFICATION

BACKGROUND OF THE INVENTION

1. Introduction

This invention relates to removal of contaminants from organic solutions. More particularly, this invention relates to removal of ionic and organic contaminants from organic solutions immediately prior to their use. The invention is especially useful for the removal of contaminants from solutions used in integrated circuit manufacture.

2. Description of the Prior Art

Ultra pure liquids free of particulate, ionic and organic contamination are required for many industrial purposes such as for the manufacture of pharmaceuticals and integrated circuits. For example, in the manufacture of high resolution integrated circuits, it is known that many processing liquids come into contact with a bare wafer or a resist-coated surface. These include photoresists and treatment chemicals such as organic liquids and aqueous solutions which contain acids, bases, oxidants, and other proprietary ingredients. At least 15 to 50 liquids of various compositions are used to clean wafers, prime surfaces, deposit resists or other polymers, develop, rinse, etch, and strip the resist. It is known that these solutions may be a source of contamination of the integrated circuit wafer that can interfere with its performance. Thus, the reduction or removal of insoluble and soluble contaminants from processing fluids used for the production of integrated circuits before or during use is basic insurance for prevention of damage to the integrated circuit.

Photoresist coating compositions are used extensively in integrated circuit manufacture. Such compositions typically comprise a light-sensitive component and a polymer binder dissolved in a solvent. Typical photoresist compositions are disclosed in U.S. Pat. Nos. 5,178,986; 5,212,046; 5,216,111; and 5,238,776, each incorporated herein by reference for disclosure of photoresist compositions, processing, and use. For example, as disclosed in said patents, a typical photoresist composition would be coated onto a substrate, dried, imaged by exposure to activating radiation, and developed to form a relief image.

It is known that photoresist coating compositions contain particulate and ionic contaminants. For example, it is known that solid gels or insolubles form in photoresists due to dark reactions. In addition, soluble impurities such as moisture, silicone oils, plasticizers, and metal ions may be present from the manufacture of the resist components and from the packaging containers or dispensing tanks. Trapped bubbles from point-of-use filtration or the shaking of a resist bottle prior to dispensing can lead to defects in resist coatings. In Class 100 clean rooms, airborne particulate counts amount to 3 particles per liter of density of 2. By comparison, liquids contain about 100,000 particles per liter. A particle count of 100,000 per liter seems high, but if translated into a solid of $0.6\mu$ in size (entity of 2), this is equivalent to 10 parts per million (ppm). A level of 10 ppm amounts to the deposition of 10 mg per liter. Since liquids are heavily contaminated compared to clean room air, effective contaminant removal is essential to the manufacture of such devices.

Filtration of resist liquids has progressed and manufacturers of resist now supply resist materials filtered through 0.04 $\mu$M diameter absolute filters. Other methods for removal of particulates such as gels include ultracentrifugation, electrostatic treatment of the resist, and depth filtration. Particulate removal from photoresists such as by filtration is not only practiced by the resist manufacturer, but is often practiced by the device manufacturer by placement of a filter between the resist dispenser and the device whereby the resist is filtered as it passes from its container onto a wafer. This procedure is known in the art as "point-of-use" filtration. A discussion of point-of-use filtration is presented by Cambria et al in SPIE Vol. 1466, "Advances in Resist Technology and Processing VIII", (1991), pp 670–675 incorporated herein by reference and by Asumi et al in SPIE Vol. 1672, "Advances in Resist Technology and Processing IX", (1992), pp 617–622.

Methods useful for removal of particulates from treatment solutions are not effective for removal of dissolved contaminants from solution such as organic impurities and ionic species. These contaminants can be at least as damaging to an integrated circuit as particulate contamination.

The removal of dissolved cationic and anionic contaminants from treatment solutions used to manufacture integrated circuits is known in the art. For example, one such method is disclosed in International Publication No. WO 93/12152, incorporated herein by reference, which is directed to removing metal ions such as sodium and iron from novolak resins during manufacture. The process comprises cation exchange treatment whereby a cation exchange resin is first washed with a mineral acid solution to reduce the level of total sodium and iron ions within the exchange resin to preferably less than 100 ppb, passing a formaldehyde reactant through the so treated cation exchange resin to decrease the sodium and iron ion content to less than 40 ppb, passing a phenolic compound through the cation exchange resin to decrease its sodium and iron ion content to less than 30 ppb, and then condensing the so treated phenolic compound with formaldehyde in the presence of an acid catalyst to form the resin.

A method for removal of ionic metals and non-metals from a photoresist is disclosed in published Japanese Patent Application No. 1228560, published Sep. 12, 1989, incorporated herein by reference. In accordance with the procedures of this application, a photosensitive resin is passed through a mixed bed of a cation exchange resin and an anion exchange resin to simultaneously remove cation and anionic species from the photoresist solution.

In copending U.S. patent application Ser. No. 08/128,994, filed Sep. 30, 1993, assigned to the same assignee as the subject application and incorporated herein by reference, an improved process is disclosed for removing metallic cations from organic solutions using modified cation exchange resins. In accordance with the process of the invention disclosed therein, the cation exchange resin is modified by replacement of the acid protons on the cation exchange groups with essentially neutral groups such as ammonium or amine groups. Thereafter, an organic solution containing acid labile components may be treated with the modified cation exchange resin to remove metal ions without the formation of undesired by-products caused by attack of acid protons on acid labile groups.

In copending U.S. patent application Ser. No. 08/143,489, filed Oct. 27, 1993, assigned to the same assignee as the subject application and incorporated herein by reference, an improved process is disclosed for removing non-metallic anions from organic solutions using a modified anion exchange resin. In accordance with the process of the invention disclosed therein, the anion exchange resin is modified by replacement of the strongly basic groups on the anion exchange groups with essentially neutral or slightly acid groups such as acetate or citrate. Thereafter, an organic solution containing base labile components may be treated with the modified anion exchange resin to remove non-metallic anions without the formation of undesired by-products caused by attack of the strong base on abase labile groups.

A method for removal of organic contaminants together with chelated multivalent metal ions from organic solutions is disclosed in copending U.S. patent application Ser. No. 08/139,923, filed Oct. 20, 1993, assigned to the same assignee as the subject application and incorporated herein by reference. In accordance with the procedures of said copending application, multivalent metal ions are first chelated with a chelating agent for the metal ions, preferably a chelating agent that is an organic impurity in the photoresist formulation such as an azo or diazo dye. The solution of the photoresist containing the chelated, multivalent metal ion is then contacted with a pure activated carbon which selectively removes organic contaminants from the solution of the photoresist including the organic contaminants chelated with the multivalent metal ions.

An additional method for removal of dissolved contaminants from a photoresist containing both acid and base labile materials is disclosed in U.S. patent application Ser. No. 08/149,041, filed concurrently herewith, assigned to the same assignee as the subject application and incorporated herein by reference. In accordance with the invention of said application, a mixed bed of cation and anion exchange resins, or an ion exchange resin having both anion and cation exchange groups on its backbone, is treated with an ammonium salt of a weak acid to displace both the strong anions and cations to thereby avoid attack on acid and base labile materials.

The above methods for purification utilized by a photoresist manufacture are capable of decreasing the concentration of contaminants from organic solution to acceptable levels. However, it has been found that following manufacture and packaging of the ultrapure materials, contaminants are often found in previously purified materials. The source of these contaminants may be the containers for the composition, pumps and tubing used to convey the composition from its container to a wafer surface and other sources found at the device manufacturer's facility.

SUMMARY OF THE INVENTION

In accordance with the invention, a process is provided whereby organic solutions are treated to remove contaminants immediately prior to use of the solution. The process comprises placement of contaminant removal means between a container from which the organic solution is dispensed and the point of end use of the solution. For example, if the device to be manufactured is an integrated circuit and the organic solution is a photoresist, contaminant removal means are disposed between the storage container for the photoresist and a wafer surface. The contaminant removal means may be a module containing any of the materials used to remove dissolved contaminants from organic solutions such as an ion exchange resin, activated carbon or mixtures of such materials. In use, the organic solution would be pumped from its container, preferably through a bed of treatment material within a module to remove contaminants and onto a wafer surface. In a preferred embodiment of the invention, the module would also contain filtering means for use in conjunction with said treatment to remove particulates together with dissolved contaminants from the organic solution.

DESCRIPTION OF THE PREFERRED EMBODIMENTS

The process of the invention is applicable to any organic solution containing dissolved contaminants but is especially useful for treating photoresist compositions containing dissolved ionic and organic contaminants. Accordingly, the description that follows will for the most part exemplify photoresist purification procedures, but the invention should not be construed as limited to this embodiment.

Photoresists are well known and described in numerous publications including DeForest, Photoresist Materials and Processes, McGraw-Hill Book Company, New York, Chapter 2, 1975 and Moreau, Semiconductor Lithography, Principles, Practices and Materials, Plenum Press, New York, Chapters 2 and 4, 1988, incorporated herein by reference.

Suitable positive-working photoresists typically contain two components—a light-sensitive compound and a film-forming polymeric binder where the light-sensitive component undergoes photochemical alteration upon exposure. Single component systems are known and typically comprise a polymer that undergoes chain scission upon exposure. The light-sensitive compounds most frequently used in two-component resist systems are esters formed from o-quinone diazide sulfonic acids, especially sulfonic acid esters of naphthoquinone diazides. These esters are well known and described by DeForest, supra, pages 47-55 and by Moreau, supra, pages 34-52. The light-sensitive compounds and the methods used to make the same are all documented in prior patents including U.S. Pat. Nos. 3,046,110; 3,046,112; 3,046,119; 3,046,121; 3,106,465; 4,596,763; and 4,588,670, all incorporated herein by reference.

The polymer binders most frequently used for positive-working photoresists in conjunction with o-quinone diazides are the alkali soluble phenol formaldehyde resins known as the novolak resins. Photoresists using such polymers are illustrated in U.S. Pat. Nos. 4,377,631 and 4,404,272. Another class of binders used with o-quinone diazides are homopolymers and copolymers of vinyl phenol. Photoresists of this nature are disclosed in U.S. Pat. No. 3,869,292.

Negative-working resists may also be treated in accordance with the invention and are well known in the art. Such photoresists typically undergo random cross-linking upon exposure to activating radiation thereby forming areas of differential solubility. Such resists often comprise a polymer and a photoinitiator. One class of negative-working resists comprise, for example, polyvinyl cinnamates as disclosed by R. F. Kelly, Proc. Second Kodak Semin. Micro Miniaturization, Kodak Publication P-89, 1966, p. 31. Other negative-acting resists include polyvinylcinnamate acetates as disclosed in U.S. Pat. No. 2,716,102; azide cyclized rubber as disclosed in U.S. Pat. No. 2,940,853; polymethyl methacrylate tetraacrylate as disclosed in U.S. Pat. No. 3,149,975; polyimide-methyl methacrylate as disclosed in U.S. Pat. No. 4,180,404; and polyvinyl phenol azide as disclosed in U.S. Pat. No. 4,148,655.

Another class of photoresists for purposes of the invention are those positive and negative acid-hardening resists disclosed in EPO application Serial No. 0 232 972 in the name of Feely et al. These photoresists comprise an acid-hardening resin and a halogenated, organic, photoacid generating compound.

Substantially all components of the photoresist composition are a potential source of dissolved contaminants. The contaminants may be metal ions such as sodium, potassium, iron, copper, chromium, nickel, molybdenum and zinc; non-metallic ions such as halides, nitrates, sulphates, phosphates, borates, or chromates; or dissolved organics such as azo and diazo dyes, diazides, and by-products and unreacted materials present as a consequence of the process used to manufacture any one or more of the components of the photoresist.

In accordance with the invention, a contaminant removal means is placed between a dispensing container for the solution to be purified and the point of use of the solution. The contaminant removal means is preferably in the form of a pellet bed through which the organic solution is passed but may be in the form of an ion exchange membrane, ion exchange fibers or other ion exchange means known to the art. Though the bed may be an open bed, it is preferable that the bed be contained within a cartridge or module through which solution is passed. The cartridge or module is preferably equipped with an inlet and outlet with fittings adapted for easy insertion into a feed line for the organic solution. Alternatively, the module may be part of the container for the organic solution, for example, an insert in the container opening installed by the supplier during packaging or inserted by the user at the time the container is opened and made ready for use.

The bed orother means for removal of contaminants contains known materials suitable for removal of contaminants from the organic solution. For example, if the organic solution contains undesired cations, the bed might contain a cation exchange resin such as those cation exchange resins known to the prior art to remove dissolved metallic contaminants from an organic solution. Suitable cation exchange resins are disclosed in U.S. Pat. No. 5,234,789 and Japanese Patent Applications Nos. 5158309, 91339728, 5148306, and 4065415, each incorporated herein by reference for disclosure of suitable cation exchange resins. Preferred cation exchange resins are those having sulfonate groups on a polymer background such as a sulfonated styrene-divinylbenzene crosslinked polymer. The most preferred cation exchange resin is a sulfonated styrene polymer sold under various tradenames such as Dowex 50X8 by Dow Chemical Company or IRN 77 or IR 118H by Rohm and Haas Company.

It is known in the art that many organic solutions including photoresist compositions contain acid labile groups that are subject to attack by cation exchange materials. For example, typical photoresist solvents containing acid labile groups include ethyl lactate, dibasic esters such as diethylsuccinate, lactones such as gamma butyrolactones, amides such as dimethyl formamide and n-methylpyrrolidone, acetals such as pyruvic aldehyde, dimethyl acetal and ketals. Typical resins used in photoresist compositions containing acid labile groups include phenolic resins having t-butyloxycarbonate esters or t-butyl acetate substitution, epoxy novolak resins, aminoplasts such as melamine resins, polyesters, polyamides, polysulfonates, polyacrylate esters and polyacetals. Typical photoactive components containing acid labile groups include the diazo naphthoquinone sulfonate esters. Other materials used in photoresist compositions possessing acid labile groups include dyes such as curcumin dye, ethyl red dye, rodamine, etc. In the case of dyes, a strong acid may not only alter the chemical composition, but also the spectral sensitivity of the resist.

To remove contaminants from materials containing acid labile groups, the cation exchange resin is desirably modified in accordance with procedures of applicant's copending U.S. patent application Ser. No. 08/128,994, filed Sep. 30, 1993 and incorporated herein by reference. In accordance with said copending application, the cation exchange resin is modified by treatment with an aqueous solution of ammonia, ammonium hydroxide, an amine or a quaternary amine whereby the strong acid proton on the exchange resin is displaced with an essentially non-acidic cation such as the ammonium ion, a protonated amine or a quaternary ammonium cation. By modifying exchange resins in this manner, an essentially non-acidic cation is available for exchange with metallic ions rather than acidic protons as in the prior art thus reducing the effect of acidic protons on acid labile groups.

If the organic solution to be dispensed in accordance with the invention contains dissolved anions such as dissolved halides, phosphates, nitrates, chromates, borates or other materials that could function as a dopant in integrated circuit manufacture, then the treatment bed of the invention may contain an anion exchange resin. Suitable anion exchange materials are known and disclosed in Japanese published patent application No. 1228560 (published Sep. 12, 1989), incorporated herein by reference, and in Samuelson, Ion Exchange Separations in Analytical Chemistry, John Wiley & Sons, New York, 1963, Chapter 2, also incorporated herein by reference. Preferred anion exchange resins are resins having structurally bound quaternary ammonium hydroxide exchange groups such as polystyrene-divinylbenzene resins substituted with tetramethyl ammonium hydroxide. A preferred anion exchange resin is crosslinked polystyrene having quaternary ammonium hydroxide substitution such as those ion exchange resins sold under the trade names Amberlyst A26-OH by Rohm and Haas Company and Dow G51-OH by Dow Chemical Company.

It is known that many photoresist compositions contain base labile groups. For example, typical photoresist solvents containing base labile groups include esters, ethers and ketones. Typical resins used in photoresist compositions containing base labile groups include epoxies, polyamides and polysiloxanes. Typical photoactive compounds used in photoresist compositions containing base labile groups include the diazonaphthoquinone sulfonate esters. Other materials used in photoresist compositions or otherwise in integrated circuit manufacture possessing base labile groups include epoxy compounds, vinyl ethers, compounds containing triaryl methyl groups, spin-on glass formulations, compounds containing Si-N bonds, Si-halogen bonds, C-P bonds, C-halogen bonds, siloxanes, etc.

For treatment of materials contacting base labile groups, the anion exchange resin may be modified in accordance with the procedures of commonly assigned copending patent application Ser. No. 08/143,489, filed Oct. 27, 1993. In accordance with the procedures disclosed therein, an anion exchange resin is modified by treatment with a solution of a source of essentially non-basic ions such as by treatment with an organic acid free of halide groups and preferably being less basic than phenol and more preferably having a $pK_a$ not exceeding 3.5. Typical organic acids include low molecular weight monocarboxylic acids such as formic acid, acetic acid, propionic acid and butyric acid and polyfunctional acids such as oxalic acid and succinic acid. It is believed that the modification of the ion exchange resin results in an essentially weak acid ion being available for exchange with the anionic contaminant rather than the —OH group as in the prior art thus reducing the affect of strong bases on base labile groups.

Many made-up photoresist compositions contain both acid and base labile materials. For treatment of such materials, an ion exchange resin may be modified in accordance with the procedures of commonly assigned copending patent application Ser. No. 08/149,041, filed concurrently herewith. In accordance with the procedures disclosed therein, a mixed bed of a cation and anion exchange resin that has been treated with an ammonium salt of a weak acid is provided and an organic solution containing acid and base labile components is passed through said bed to remove dissolved ionic contaminants. Treatment of the mixed bed of exchange resins with an ammonium salt of a weak acid results in displacement of strong acid protons with a weak acid and displacement of strong basic anions with an essentially non-basic ammonium anion. Displacement of the strong acid and base from the exchange resin permits treatment of organic solutions containing acid and base labile materials without undesired by-product formation.

Another method for removing contaminants from an organic solution involves treatment with activated carbon in accordance with the procedures of copending U.S. patent application Ser. No. 08/139,923, filed Oct. 20, 1993, assigned to the same assignee as the subject application and incorporated herein by reference.

Treatment with activated carbon is desirable for organic solutions containing organic contaminants together with multivalent metal ions such as iron, copper, chromium, nickel, molybdenum and zinc. In accordance with the invention of the above-identified copending application, a component to be purified is dissolved in an organic solution and the multivalent metal ion contaminant in solution is chelated with a chelating agent followed by contact of the solution with the high purity activated carbon adsorbent. Many of the organic solutions used in integrated circuit manufacture, such as photoresists, contain impurities that are chelating agents for the multivalent metal ions. For example, o-quinonediazide acid esters and diazide photoactive compounds are known to contain dyes such as azo dyes, diazo dyes and azides that function as chelating agents for multivalent metal ions. Chelation of the multivalent ion with such impurities is believed to take place through hydroxyl groups and one of the nitrogens in the dye impurity which contributes an electron pair. Where the material to be purified contains a chelating agent as an impurity, an additional chelating agent may not be needed. If the material to be purified does not contain a chelating agent, then a chelating agent is mixed with the organic solution to chelate the multivalent metal ions prior to contact with activated carbon.

The organic solution containing the chelated multivalent metal ions together with other organic impurities is then contacted with activated carbon to absorb the organic impurities and multivalent metal ions thereby removing the same from solution.

The activated carbon used for the purification is desirably a high purity activated carbon essentially free of metal ion contamination. The activated carbon is preferably porous and in granular form having an average particle size of between 10 and 200 microns with an effective surface area of from 500 to 5,000 square meters per gram. In a preferred embodiment of the invention described in said copending application, the activated carbon is the product resulting from pyrolysis of a carbon-based cation exchange resin. The pyrolysis of the cation exchange resin to form activated carbon adsorbents is known in the art and disclosed in the literature such as in U.S. Pat. Nos. 4,342,839; 4,839,331; 4,957,897; 5,094,754; and 5,217,505. Most preferred for purposes of removing chelated multivalent metal ions are activated carbons formed by pyrolysis of macroporous poly(vinyl aromatic) resins. These materials are preferred because it is believed that the activated carbon retains cation exchange groups which enhance the removal of the metal ions from solution.

To practice the process of the invention, an end user of the organic solution cognizant of the contaminants encountered through the use of such solutions would provide a module containing any one or more of the above-described materials. The module may consist of a blend of exchange resins with or without activated carbon or the materials may be layered within a module or separate modules may be used in series with each other as desired.

In a preferred embodiment of the invention, the module containing the materials for removing dissolved contaminants would be used in conjunction with a point-of-use filter to remove particulate contaminants from the organic solution. Point-of-use filtration is known to the art and described in the SPIE references, supra. Typically, such filters comprise a cartridge containing a membrane filter having a pore size of about 200 nm or less. The organic solution is passed through the filter under pressure to remove particulates. In accordance with the subject invention, the point-of-use filter may be placed immediately before or after the module for removing dissolved contaminants, but is preferably placed after said module whereby the organic solution is passed in series through the two purification means.

EXAMPLE 1

This example illustrates a process for removing mobile metallic ions from a photoresist using a cation exchange resin modified to prevent attack by strong acid protons on acid labile materials.

One hundred grams of a sulfonic acid ion exchange resin identified as Rohm and Haas IRN 77 (26 grade) are slurried with a 20% aqueous ammonium hydroxide solution with constant stirring for 4 hours. The so treated resin is then washed with 8 bed volumes of deionized water and treated with a solvent mixture of ethyl lactate, butyl acetate, and xylene (90:5:5 by weight) in an amount sufficient to remove greater than 98% of all residual moisture.

A photoresist having the following composition was provided:

| | |
|---|---|
| Novolak resin[1] | 18.96 grams |

| | |
|---|---|
| Photoactive compound[2] | 4.54 grams |
| Solvent[3] | 76.50 grams |

[1]Novolak formed from 52.5% p-cresol, 5.5% o-cresol and 42.0% m-cresol.
[2]2,1,5-naphthoquinone diazide sulfonic acid ester.
[3]Mixture of 60% by volume ethyl lactate, 30% anisole and 10% amyl acetate.

An ion exchange resin prepared as described above was used to treat the above photoresist composition. A glass column measuring 60 cm. in length and 2.5 cm. in diameter was filled with the ion exchange resin to a depth of 45 cm. The photoresist solution was passed through the column at a flow rate of 4 bed volumes per hour. The metal ion concentration was reduced from greater than 500 ppb parts of resist to less than 10 ppb parts.

EXAMPLE 2

This example illustrates a process for removing dissolved anions from a photoresist using an anion exchange resin modified to prevent attack by strong acid protons on base labile materials.

One hundred grams of a quaternary ammonium anion resin were slurried in a 10% acetic acid solution for 4 hours. The resin was then washed with 8 to 10 bed volumes of deionized water to a pH of 7. It was then dehydrated by rinsing several times with acetone. The resin was then packed into a column. Five grams of a diazonaphthoquinone diazide photoactive compound consisting of mixed esters formed by the reaction of 2,1,5-diazonaphthoquinone diazide sulfonic acid and trihydroxybenzophenone (THBP) was dissolved in 100 ml of acetone and the solution passed over a column. Chloride levels dropped from 20 ppm to less than 1 ppm (the detection limit of the test).

EXAMPLE 3

This example illustrates a process for removing dissolved multivalent cations and anions from a photoresist using activated carbon.

Five grams of a diazonaphthoquinone diazide photoactive compound consisting of mixed esters formed by reaction of 2,1,5-diazonaphthoquinone diazide sulfonic acid and trihydroxy- benzophenone (THBP) were dissolved in 100 ml of ethyl lactate. The solution contained iron ions in an amount of 700 ppb. The solution was passed through a column packed with 100 grams of Norit A activated carbon at a rate of about 8 bed volumes per hour. The solution was then analyzed by high pressure liquid chromatography to detect organic impurities and (graphite furnace) atomic absorption spectroscopy to detect iron ions. Organic impurities were removed to the limit of detection. The analysis for iron revealed a decrease of from 700 ppb to 60 ppb.

The procedure was repeated using a 150 ml sample of S1400 ® photoresist available from Shipley Company Inc. of Marlborough, Mass. which consists of a naphthoquinone diazide sulfonic acid and a novolak resin dissolved in a solvent. The solution was treated by passing the same through a column containing 100 grams of AMBERSORB ® 572 activated carbon adsorbent. Prior to carbon treatment, the resist contained 120 ppb of iron. Following carbon treatment, over 60% of the iron species had been removed. Subsequent passes through the column improved the purification of the resist and ultimately gave an iron concentration of 10 ppb.

EXAMPLE 4

This example illustrates a process for removing dissolved multivalent cations from a photoresist using a cation exchange resin followed by point-of-use filtration.

A barrel-shaped housing was filled with a cation sulfonic acid ion exchange resin available from J. T. Baker and identified as 7090 Ion exchange resin. The housing was connected to a 0.2 $\mu M$ teflon membrane filter. A photoresist identified as S1400 photoresist of Shipley Company Inc. consisting of a novolak resin and an o-naphthoquinone diazide sulfonic acid ester photoactive compound dissolved in a solvent was forced through the exchange resin and filter under pressure directly onto a silicon wafer. Sodium level was reduced from 840 ppb to 45 ppb and iron level was reduced from 125 ppb to 100 ppb.

We claim:

1. A process for coating a liquid organic photoresist composition onto a wafer for integrated circuit manufacture, said process comprising the steps of providing a dispensing means for dispensing said organic composition, a wafer upon which said organic composition is to be coated, and purification means disposed between said dispensing means and said wafer, said purification means comprising a module containing a member selected from the group consisting of at least one ion exchange resin, an activated carbon adsorbent and mixtures thereof, passing said organic photoresist composition from said dispensing means through said purification means to said wafer and drying said photoresist coating.

2. The process of claim 1 where said purification means further includes filtering means downstream from said module.

3. The process of claim 1 where said module is part of said dispensing means.

4. The process of claim 1 wherein said module is equipped with inlet and outlet fittings providing means for inserting said photoresist composition into a feedline.

5. The process of claim 1 where said module is affixed to said dispensing means.

6. The process of claim 1 wherein said module contains a mixed anion and cation exchange resin and activated carbon.

7. The process of claim 1 where said module contains a cation exchange resin.

8. The process of claim 7 where said photoresist composition contains acid labile materials and said cation exchange resin has been modified to replace strong acid groups with essentially non acidic groups.

9. The process of claim 1 where said module contains an anion exchange resin.

10. The process of claim 9 where said photoresist composition contains base labile materials and said anion exchange resin has been modified to replace strong basic groups with a group less basic than hydroxyl.

11. The process of claim 1 where said module contains activated carbon.

12. The process of claim 11 where said photoresist composition contains a chelating agent for multivalent metal ions.

* * * * *